United States Patent
Levy et al.

(10) Patent No.: US 7,085,176 B1
(45) Date of Patent: Aug. 1, 2006

(54) ON-CHIP POWER-ON VOLTAGE INITIALIZATION

(75) Inventors: Howard L. Levy, Cedar Park, TX (US); Nadeem N. Eleyan, Austin, TX (US); Nayon Tomsio, Austin, TX (US); Hong S. Kim, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 84 days.

(21) Appl. No.: 10/771,526

(22) Filed: Feb. 4, 2004

(51) Int. Cl.
*G11C 7/00* (2006.01)

(52) U.S. Cl. .............................. 365/189.11; 365/230.08; 365/233; 365/194

(58) Field of Classification Search .................... None
See application file for complete search history.

(56) References Cited

U.S. PATENT DOCUMENTS 6,011,746 A * 1/2000 Oh ..................... 365/230.06

* cited by examiner

*Primary Examiner*—David Lam
(74) *Attorney, Agent, or Firm*—Zagorin O'Brien Graham LLP

(57) ABSTRACT

It has been discovered that initialization of a memory array can be improved by setting the nodes of the memory array to a predetermined value automatically upon applying power to the integrated circuit. Data input nodes and a memory write enable node are configured to store the predetermined values on the nodes of the memory array in response to successive enablement of word lines corresponding to the nodes of the memory array and automatic reset of the word lines. Circuitry included for initializing control and data signals of the memory array are effectively disabled upon termination of the initialization. Inclusion of circuitry that initiates and terminates the initialization obviates an additional input/output pin for this purpose.

49 Claims, 6 Drawing Sheets

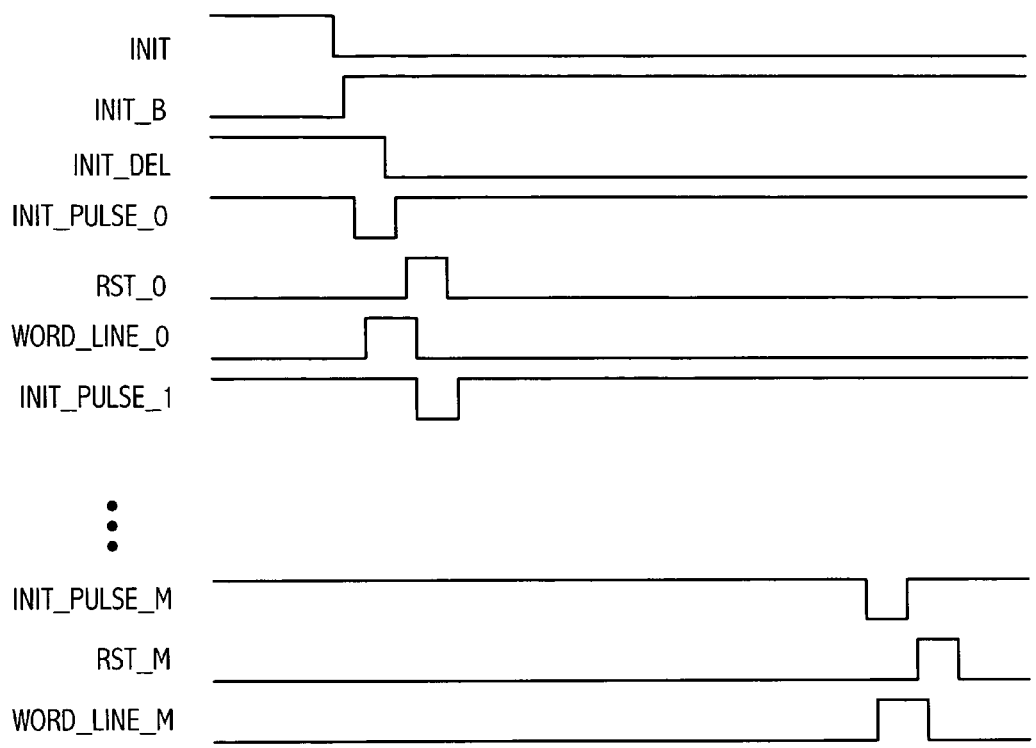
FIG. 3A
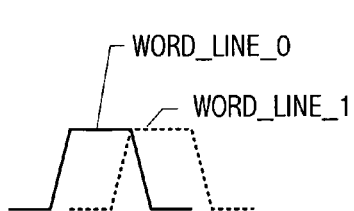 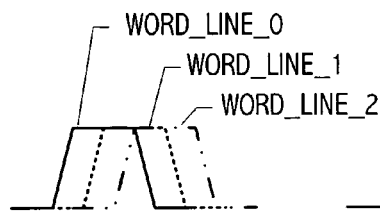 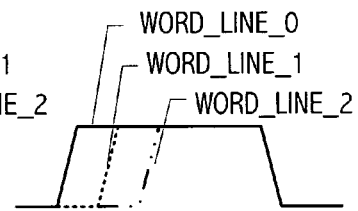
FIG. 3B          FIG. 3C          FIG. 3D

ON-CHIP POWER-ON VOLTAGE INITIALIZATION

CROSS-REFERENCE TO RELATED APPLICATION(S)

BACKGROUND

1. Field of the Invention

The present invention relates generally to integrated circuits and, more particularly, to initializing nodes of an integrated circuit.

2. Description of the Related Art

Typically, modern integrated circuits incorporate nodes e.g., latch nodes and memory nodes, that may power up in either of two states. These nodes preferably receive predetermined values upon applying power to the integrated circuit. The predetermined values are typically written during an initialization cycle. Writing predetermined values to a memory array generally consumes a significant amount of time, which increases with the size of the memory array. For example, the memory array may be initialized by executing a sequence of individual write instructions to the memory array. The initialization of memory arrays may increase test time of the memory design or delay commencing desired functional activity. Accordingly, there is a need for improved techniques for setting nodes of an integrated circuit to a predetermined value upon applying power to the integrated circuit.

SUMMARY

It has been discovered that initialization of a memory array can be improved by setting the nodes of the memory array to predetermined values automatically upon applying power to the integrated circuit. Data input nodes and a memory write enable node are configured to store the predetermined values on the nodes of the memory array in response to successive enablement and automatic reset of word lines corresponding to the nodes of the memory array. Circuitry included for initializing control and data signals of the memory array is effectively disabled upon termination of the initialization. The integrated circuit may include circuitry that initiates and terminates the initialization, thus obviating an additional input/output pin for this purpose.

In some embodiments of the present invention, a method for initializing a memory circuit includes detecting that a power supply operably coupled to the memory circuit first achieves a first predetermined voltage. The method also includes asynchronously pulsing successive word line groups of one or more individual word lines of the memory array while conveying a data pattern onto bit lines of the memory array, to thereby write the data pattern into memory cells associated with each such word line group. The asynchronously pulsing may include, for at least one word line group, pulsing a first word line group in response to an input signal received from an earlier pulsed second word line group, generating an output signal delayed from the input signal, and conveying the delayed output signal to a third word line group.

In some embodiments of the present invention, a system includes an array of memory cells arranged in rows and columns, a plurality of word lines corresponding to respective rows of the array, a plurality of bit lines corresponding to respective columns of the array, and a plurality of serially-connected word line driver initialization circuits, each for pulsing a respective group of one or more individual word lines of the memory array. The system also includes a control circuit for generating an input signal for the first of the serially-connected word line driver initialization circuits when a power supply operably coupled to the memory circuit first achieves a first predetermined voltage. The system also includes a plurality of data circuits for conveying a data pattern onto the bit lines of the memory array during the pulsing of the word line groups. The system may include an initialization circuit including a first circuit, the first circuit being coupled to a first node and the power supply, the first circuit generating an enable signal having a response based at least in part on the power supply and the first predetermined voltage.

In some embodiments of the present invention, an integrated circuit includes a first node conveying an enable signal, a second node conveying an initialization signal, a level shifting circuit coupled to the first node and a power supply node, a hysteresis circuit coupled to the first and second nodes, and a latch node coupled to receive a first predetermined state in response to a first signal based at least in part on the initialization signal. The level shifting circuit generates the enable signal based at least in part on a signal conveyed by the power supply node and a predetermined initialization disable voltage. The hysteresis circuit generates the initialization signal.

BRIEF DESCRIPTION OF THE DRAWINGS

The present invention may be better understood, and its numerous objects, features, and advantages made apparent to those skilled in the art by referencing the accompanying drawings.

FIG. 3A illustrates exemplary signal waveforms in accordance with some embodiments of the present invention.

FIG. 3B illustrates exemplary signal waveforms in accordance with some embodiments of the present invention.

FIG. 3C illustrates exemplary signal waveforms in accordance with some embodiments of the present invention.

FIG. 3D illustrates exemplary signal waveforms in accordance with some embodiments of the present invention.

The use of the same reference symbols in different drawings indicates similar or identical items.

DESCRIPTION OF THE PREFERRED EMBODIMENT(S)

Figure 1:
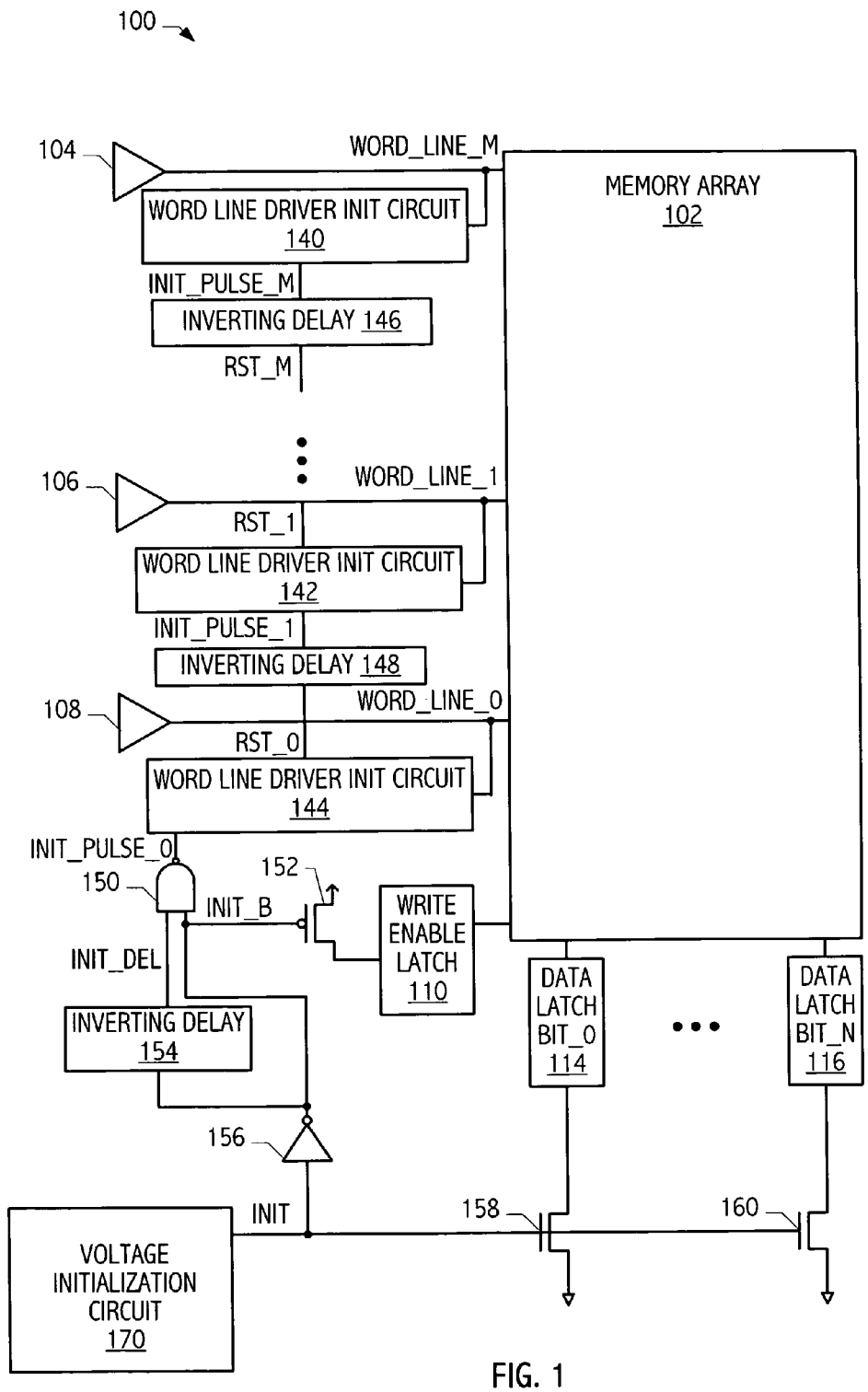
FIG. 1 illustrates an exemplary system in accordance with some embodiments of the present invention.

A series of mechanisms have been developed for initializing nodes of an integrated circuit upon applying power to the integrated circuit. Referring to FIG. 1, memory array 102 is coupled to typical circuit elements 104, 106, 108, 110, 114, and 116. In addition, memory array 102 is coupled to initialization circuit elements 140, 142, ..., 160, and 170. In an exemplary realization of the present invention, memory array 102 is an M+1 by N+1 bit static random access memory (SRAM) that, under typical operating conditions, is word line selectable, e.g., by signals driven by word line drivers 104, 106, and 108 on WORD_LINE_0, WORD_LINE_1, ..., WORD_LINE_M. A word line may also be referred to as a row line or a select line and no inference to the organization of number of bits per word is implied by such terminology. The memory elements receive data from data latches 114 and 116 in response to the WORD_LINE signals and a write enable signal stored in write enable latch 110. Although only three such word lines are depicted, it should be understood that in actual practice many more word lines may be implemented. Similarly, while only two such data latches are depicted, it should be understood that in actual practice many more data latches may be implemented. Moreover, other critical signals, such as read control signals in the column circuitry, decoders, etc. may be implemented in actual practice.

Referring to the system 100 of FIG. 1 and corresponding waveforms in FIG. 3A, initialization is controlled by INIT, a signal generated on-chip by voltage initialization circuit 170. However, INIT may be generated off-chip and communicated to system 100 via an input/output port. In an exemplary system, INIT transitions low when the power supply node, during power-on transient, achieves a minimum functional voltage, i.e., a voltage at which the circuits of system 100 will function as intended. This functional voltage may be the same as or different from the operating voltage of the integrated circuit.

While INIT is high, discharge devices, e.g., n-type transistors 158 and 160 keep nodes within data latches, e.g., data latch bit_0 114 and data latch bit_N 116, so that the data latches power up with a known value of '0.' Note that this configuration will initialize the elements of memory array 102 to '0.' However, system 100 may be modified to initialize the elements of memory array 102 to '1' or to any combination of values by coupling the data latches to p-type transistors or a combination of n-type transistors and p-type transistors coupled to INIT and INIT_B. In addition, the initialization values may be programmable by selectively coupling (e.g., using fuses, anti-fuses, or any other suitable circuit element) data latches 114 and 116 to n-type transistors and p-type transistors according to a desired initialization pattern. INIT may be sufficiently buffered to drive any number of n-type transistors, p-type transistors or other devices that initialize signals coupled to memory array 102, or other memory circuits that are preferably initialized.

INIT_B enables pull-up device 152 to charge a node within write enable latch 110. During this time, INIT_DEL and INIT_PULSE_0, INIT_PULSE_1, ..., INIT_PULSE_M are high and RST_0, RST_1, ..., RST_M are low. Word line driver initialization circuits 140, 142, and 144 are effectively disabled, failing to charge or discharge WORD_LINE_0, WORD_LINE_1, ..., WORD_LINE_M. When INIT transitions from high to low, transistors 152, 158, and 160 are turned off. However, assuming that clock signals to these latches are effectively disabled at this time, write enable latch 110 and data latches 114 and 116 hold the initialization values introduced by p-type transistor 152 and n-type transistors 158 and 160.

Upon a falling edge of NIT (i.e., when INIT transitions low), nand gate 150 and inverting delay 154 generate a low pulse on INIT_PULSE_0. Specifically, when INIT transitions low, INIT_B transitions high, and INIT_DEL remains high for an interval of time determined by the length of delay introduced by inverting delay 154. When both INIT_DEL and INIT_B are high, the output of nand 150, i.e., INIT_PULSE_0 is low. INIT_PULSE_0 remains low during an interval of time (i.e. during the width of the low pulse that is generated by inverting delay 154 and nand 150) that is a function of the length of the delay produced by inverting delay 154. In an exemplary embodiment, inverting delay 154 includes a series of inverters. However, nand gate 150 and inverting delay 154 are exemplary and may be substituted with any suitable circuits. When INIT is low, exemplary n-type transistors 158 and 160 are disabled and have no significant effect on data latches 114 and 116. INIT_B is high, and p-type transistor 152 is disabled, having no significant effect on write enable latch 110.

Figure 2A:
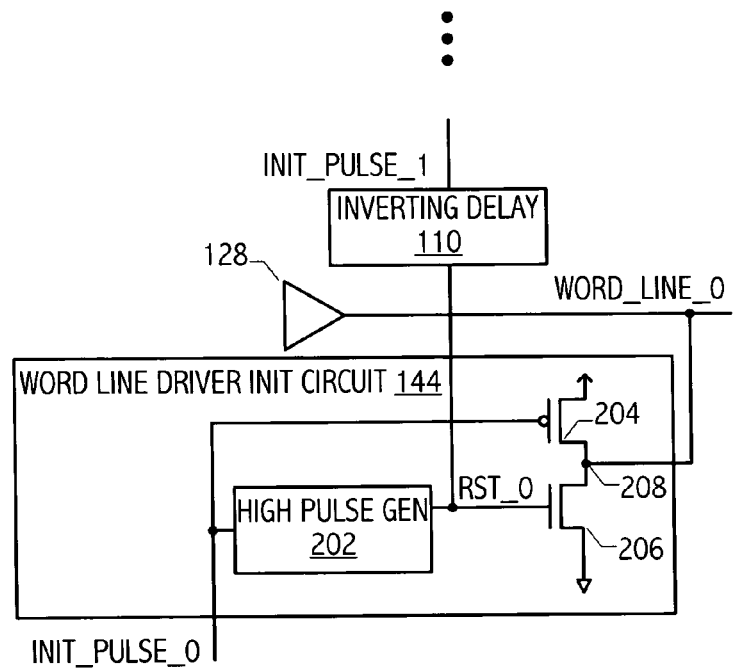
FIG. 2A illustrates an exemplary word line driver initialization circuit in accordance with some embodiments of the present invention.
Figure 2B:
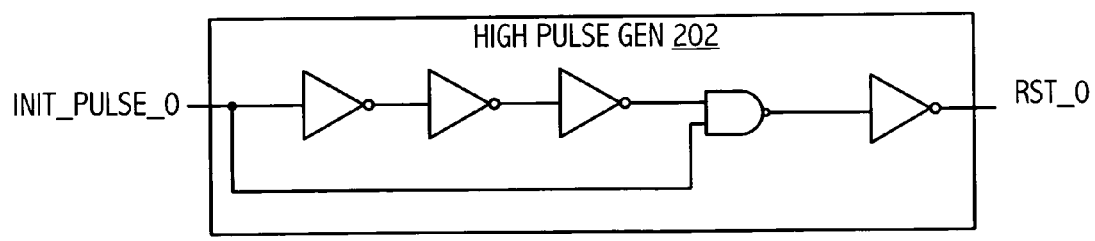
FIG. 2B illustrates an exemplary high pulse generator circuit in accordance with some embodiments of the present invention.

An exemplary word line driver initialization circuit 144 is illustrated in FIG. 2A. When INIT_PULSE_0 is high, p-type transistor 204 is effectively turned off. Upon a rising edge of INIT_PULSE_0, high pulse generator 202 generates a high pulse on RST_0. An exemplary high pulse generator circuit is illustrated in FIG. 2B, although high pulse generator 202 may be any suitable circuit. When INIT_PULSE_0 is high, RST_0 is low, effectively turning off n-type transistor 206. Since both p-type transistor 204 and n-type transistor 206 are effectively turned off when INIT_PULSE_0 is high, word line driver initialization circuit 144 fails to charge or discharge WORD_LINE_0, and WORD_LINE_0 and node 208 float if driver 128 is not driving WORD_LINE_0.

The falling transition of INIT causes inverting delay 154 and nand 150 of FIG. 1 to generate a low pulse on INIT_PULSE_0, as discussed above. Referring to FIG. 2A, this low pulse enables p-type transistor 204 of word line driver initialization circuit 144 to charge node 208 and WORD_LINE_0. Upon completion of the pulse on INIT_PULSE_0, i.e., INIT_PULSE_0 transitions high and high pulse generator 202 produces a high pulse on RST_0, consequently enabling n-type transistor 206. Then, n-type transistor 206 discharges node 208, effectively resetting WORD_LINE_0. The high pulse generator 202 then drives node RST_0 back to ground, terminating the pulse, and disabling transistor 206.

Referring to FIGS. 1 and 3A, in some embodiments of the present invention, more than one word line is configured to be high to write corresponding memory elements during the interval that WORD_LINE_0 selects memory element(s) for initialization. The individual word lines may be pulsed in a partially or substantially overlapped group (see e.g., FIG. 3B and FIG. 3C), and may be uniformly deasserted (see e.g., FIG. 3D). However in an exemplary embodiment, driver circuits 140, 142, and 144 are configured to drive corresponding word lines during successive, non-overlapping intervals. For example, RST_0 is coupled to inverting delay 110 to generate INIT_PULSE_1. INIT_PULSE_1 is similar to INIT_PULSE_0, but is delayed, the amount of the delay determined by at least high pulse generator 202 and inverting delay 110. INIT_PULSE_1 enables a corresponding p-type transistor in word line driver initialization circuit 142 to drive WORD_LINE_1. INIT_PULSE_1 also drives a corresponding high pulse generator to produce RST_1, which resets the WORD_LINE_1. RST_1 triggers the initialization of the next word line in succession. Additional inverting delay circuits, e.g., inverting delay 146, may be coupled to successively enable multiple word lines for initialization of corresponding memory elements included in memory array 102 or other memory elements on the integrated circuit. In some realizations of the present invention, the word lines are successively enabled asynchronously (i.e., without reference to a timing clock) within a single clock cycle. This may be achieved for a sufficiently large number of word lines by operating at a slow clock speed during initialization, or by any other suitable technique.

During post-initialization operation, INIT is low, i.e., '0', and initialization circuit elements 140, 142, . . . , 160 are effectively disabled, e.g., circuit elements 140, 142, . . . , 160, and 170 do not drive word lines and latches coupled to these circuit elements. For example, when INIT is '0', discharge devices 158 and 160 are effectively disabled, thus failing to discharge or otherwise interfere with operation of data latch bit 0 and data latch bit N. Under these circumstances, INIT_B is high, i.e., '1', and pull-up transistor 152 is effectively disabled, thus failing to charge or otherwise interfere with operation of write enable latch 110. In addition, word line driver initialization circuits 140–44 are effectively disabled, i.e., word line driver initialization circuits 140, 142, and 144 fail to drive WORD_LINE_0, WORD_LINE_1, . . . , WORD_LINE_M. Signals from drivers 104, 106, and 108 and clocked signals or other signals driven to write enable latch 110 and data latches 114 and 116 will not be substantially impeded by the initialization circuitry during post-initialization operation.

Figure 4:
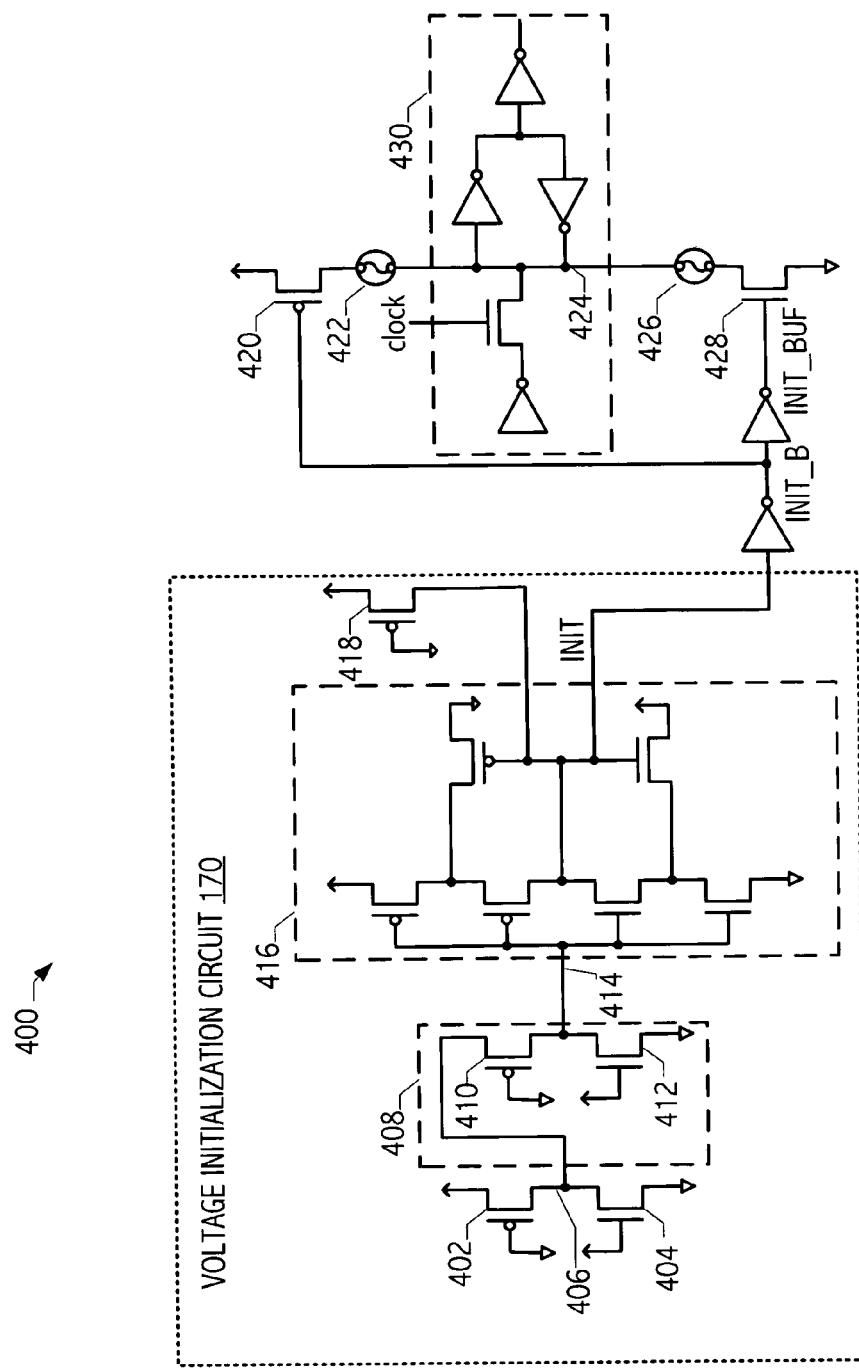
FIG. 4 illustrates an exemplary voltage initilization circuit in accordance with some embodiments of the present invention.

Although INIT may be received from an input/output pin, this signal may be generated on-chip by voltage initialization circuit 170. An exemplary voltage initialization circuit 170 is illustrated in FIG. 4. Voltage initialization circuit 170 is coupled to initialize a single illustrative latch 430. When INIT is high, transistors 420 and 428 are effectively enabled and node 424 is charged or discharged according to selective connectors 422 and 426, respectively. Typically, only one of n-type transistor 428 and p-type transistor 420 may be present or may be effectively coupled to node 424 for a given latch. Selective connectors 422 and 426 may be fuses, anti-fuses, or any other suitable device. When INIT is low, n-type transistor 428 and p-type transistor 420 are effectively disabled and node 424 receives data according to the clock signal.

On-chip voltage initialization circuit 170 includes circuitry to generate an INIT signal consistent with system 100 and consistent with initializing node 424 of circuit 400, and other similar systems. On-chip voltage initialization circuit 170 includes a level shifting circuit, i.e., a number of p-type transistors with grounded gate terminals, e.g., p-type transistors 402 and 410, coupled in series and coupled to weak n-type transistors (i.e., an n-type transistor designed to have a low gain achieved by a small W/L ratio) with gate terminals coupled to a power supply node, e.g., n-type transistors 404 and 412, respectively. The output of these p-type transistors, e.g., node 414, is coupled to a Schmitt trigger, e.g., circuit 416. The power supply transitions slowly from 0V to an operating voltage, e.g., 1.3 V. At the start of this transition, the voltage across the gate and source of p-type transistor 402 and the voltage across the gate and source of p-type transistor 410 are below the threshold voltage of these p-type transistors. Once the power supply voltage reaches the threshold voltage and continues to slowly increase, p-type transistors 402 and 410 begin to slowly draw current. While these currents are small, the weak n-type transistors 404 and 412 maintain a low voltage at nodes 406 and 414, respectively. Weak p-type transistor 418 (i.e., a p-type transistor designed to have a low gain achieved by a small W/L ratio) maintains INIT at the supply voltage until circuit 416 resets, i.e., transitions to '0'.

Figure 5:
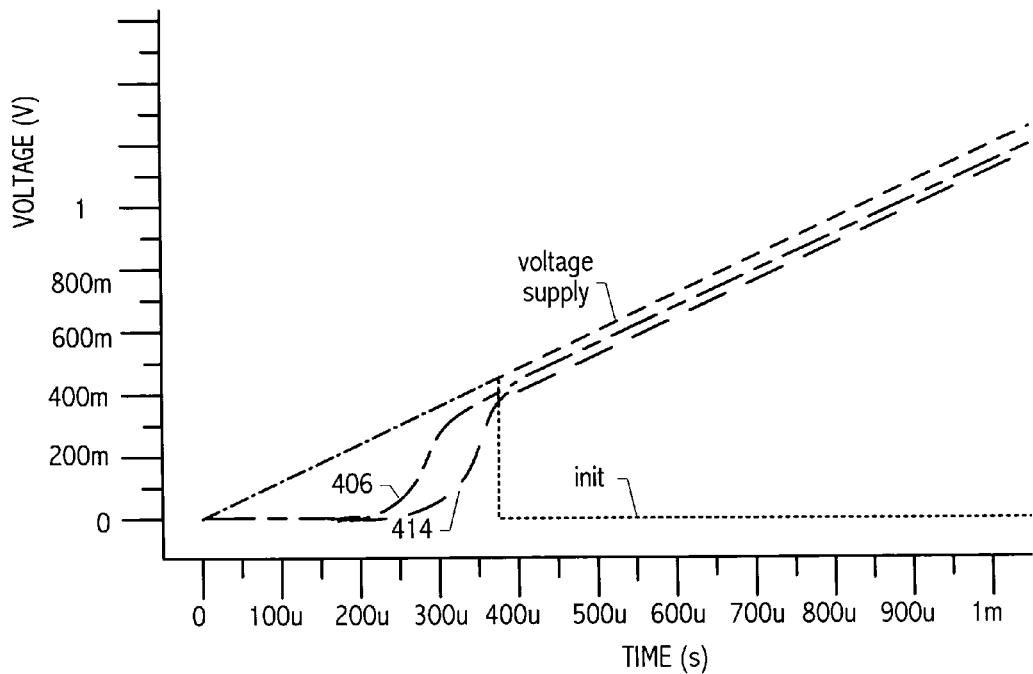
FIG. 5 illustrates exemplary signal waveforms in accordance with some embodiments of the present invention.
Figure 6:
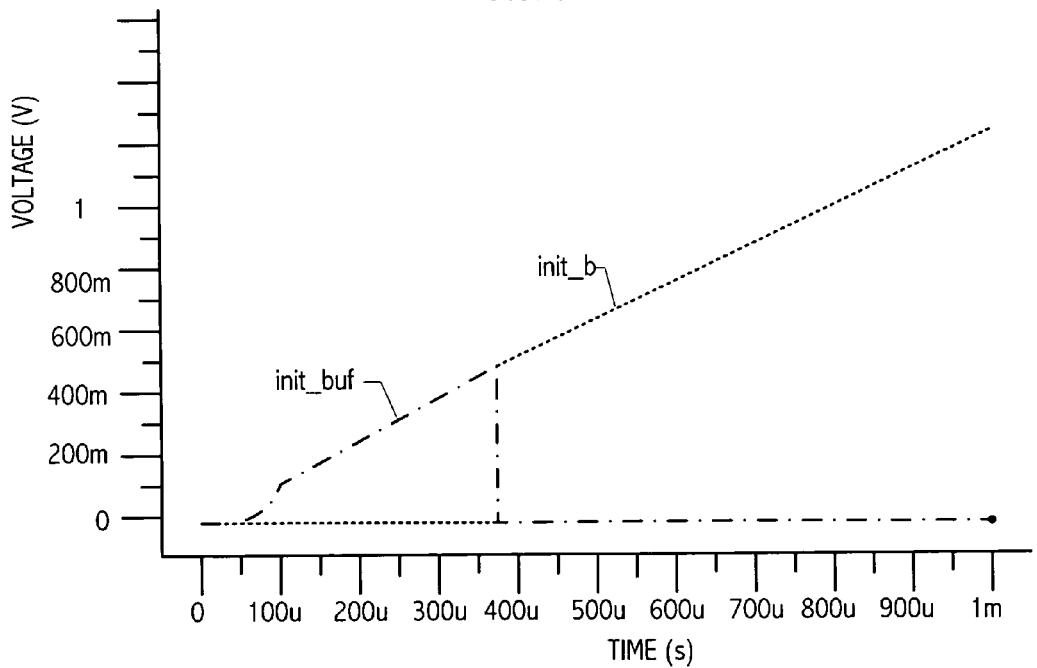
FIG. 6 illustrates exemplary signal waveforms in accordance with some embodiments of the present invention.

Once the power supply reaches a sufficient voltage level (e.g., 100 mV in 130 nm technology) above the p-type transistor threshold voltage, p-type transistor 402 begins to overcome the weak n-type transistor 404. A short time later, p-type transistor 410 wins over weak n-type transistor 412 and node 414 begins to transition high. Once node 414 reaches the threshold voltage of Schmitt trigger 16, the output of circuit 416 transitions low, i.e., circuit 416 overcomes weak p-transistor 418 and the INIT node transitions to 0V. This behavior is illustrated in FIGS. 5 and 6. Circuit block 408 may be repeated and coupled according to a desired power supply voltage that disables the INIT signal since each such stage 408 increases the effective trip point of 416 by about 50 mV for an exemplary embodiment. INIT drives a device that initializes a node of memory element 430. For example, the node of memory element 430 may be p-type transistor 420 or n-type transistor 428 selectably coupled to node 424, or another n-type or p-type transistor coupled to node 424.

Figure 7:
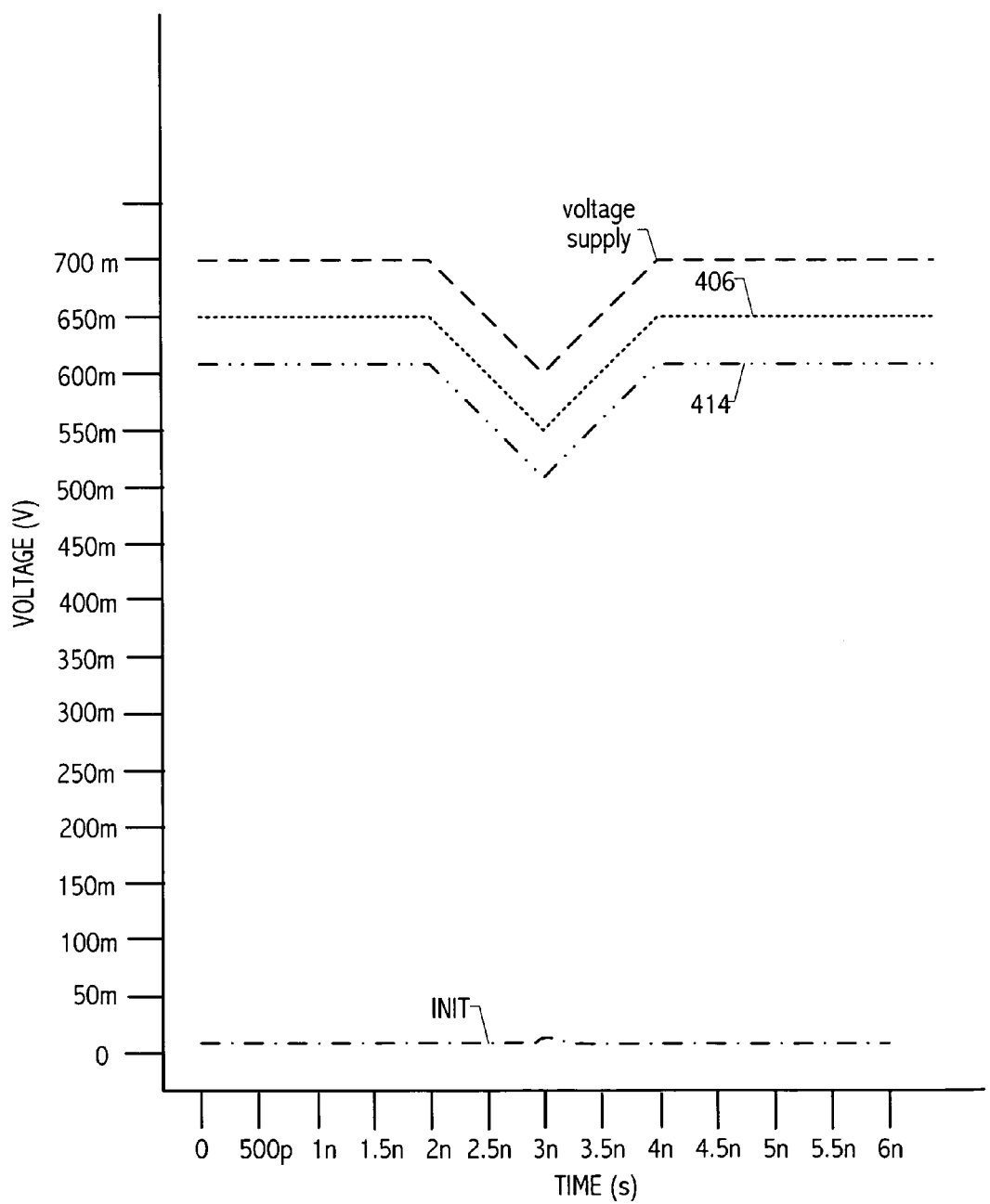
FIG. 7 illustrates exemplary signal waveforms in accordance with some embodiments of the present invention.

Circuit 416 is typically a Schmitt trigger circuit, i.e., a circuit that responds to a slowly changing input waveform with fast transition times at the outputs and which includes different input thresholds for rising and falling input voltage signals. Circuit 416 has a threshold voltage for the rising input signal that is higher than the threshold voltage for the falling input signal, i.e., the input voltage that an input signal must fall below to transition the output to a high voltage is lower than the input voltage that an input signal must exceed to transition the output to a low voltage. An exemplary embodiment of a Schmitt trigger circuit is illustrated in FIG. 4, but any Schmitt trigger circuit or other suitable hysteresis circuit may be substituted for circuit 416. The hysteresis characteristic of circuit 416 provides tolerance to noisy signals. Once the power supply reaches a functional voltage, INIT remains low although substantial noise glitches occur on the power supply. This characteristic is illustrated in FIG. 7. Although a 100 mV glitch occurs on the power supply, the INIT signal remains off.

While circuits and physical structures are generally presumed, it is well recognized that in modern semiconductor design and fabrication, physical structures and circuits may be embodied in computer readable descriptive form suitable for use in subsequent design, test, or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. In addition, structures and functionality presented as discrete components in the exemplary configurations may be implemented as a combined structure or component. Finally, various features of certain embodiments of the present invention may be used alone or in combination. These and other variations, modifications, additions, and improvements may fall within the scope of the invention as defined in the claims that follow.

What is claimed is:

1. A method for initializing a memory circuit comprising:
detecting that a power supply operably coupled to the memory circuit first achieves a first predetermined voltage; and
asynchronously pulsing successive word line groups of one or more individual word lines of the memory array while conveying a data pattern onto bit lines of the memory array, to thereby write the data pattern into memory cells associated with each such word line group.

2. The method, as recited in claim 1, wherein each word line group pulse is non-overlapping with other such word line group pulses.

3. The method, as recited in claim 1, wherein word line groups include a single individual word line.

4. The method, as recited in claim 1, wherein word line groups include more than one individual word line.

5. The method, as recited in claim 4, wherein word lines within a group are physically adjacent word lines.

6. The method, as recited in claim 1, wherein the asynchronously pulsing includes, for at least one word line group:
pulsing a first word line group in response to an input signal received from an earlier pulsed second word line group;
generating an output signal delayed from the input signal; and
conveying the delayed output signal to a third word line group.

7. The method, as recited in claim 1, wherein each word line group is driven by a respective driver circuit, at least one driver circuit being enabled in response to a signal received from a driver circuit for a previously enabled word line group, and wherein at least one driver circuit generates a delayed output signal for enabling another word line group.

8. The method, as recited in claim 1, further comprising:
ensuring at least one data latch powers up having a first predetermined state corresponding to at least one bit of the data pattern.

9. The method, as recited in claim 1, further comprising:
ensuring a write enable latch node powers up having a state for enabling bit line drivers to the memory circuit.

10. The method, as recited in claim 1, wherein the memory circuit is initialized within a maximum of one clock cycle.

11. The method, as recited in claim 1, further comprising:
effectively disabling initialization circuitry after initializing the memory circuit.

12. The method, as recited in claim 1, wherein a node responsive to an input/output signal indicates that the power supply node achieved the first predetermined voltage.

13. The method, as recited in claim 1, wherein a circuit coupled to a power supply node indicates that the power supply achieved the first predetermined voltage.

14. The method, as recited in claim 13, wherein the circuit continues to indicate that the power supply node achieved the first predetermined voltage while the power supply node conveys a voltage greater than a second predetermined voltage less than the first predetermined voltage.

15. The method, as recited in claim 1, further comprising:
selectively configuring the data pattern.

16. A system comprising:
an array of memory cells arranged in rows and columns;
a plurality of word lines corresponding to respective rows of the array;
a plurality of bit lines corresponding to respective columns of the array;
a plurality of serially-connected word line driver initialization circuits, each for pulsing a respective group of one or more individual word lines of the memory array;
a control circuit for generating an input signal for the first of the serially-connected word line driver initialization circuits when a power supply operably coupled to the memory circuit first achieves a first predetermined voltage; and
a plurality of data circuits for conveying a data pattern onto the bit lines of the memory array during the pulsing of the word line groups.

17. The system, as recited in claim 16, wherein at least one word line driver is responsive to a respective input signal received from another word line driver initialization circuit and generating a respective output signal delayed from its respective input signal and conveying said delayed output signal to yet another word line driver initialization circuit.

18. The system, as recited in claim 16, wherein each word line driver initialization circuit respectively comprises:
a control input for receiving a control signal;
an output for conveying a word line pulse reset; and
an output for conveying a word line pulse based at least in part on the control signal and the word line pulse reset.

19. The system, as recited in claim 16, wherein the plurality of data circuits are coupled to power up having the data pattern.

20. The system, as recited in claim 16, wherein the input signal is based at least in part on a signal received from an input/output pin.

21. The system, as recited in claim 16, wherein the input signal is based at least in part on a first signal generated by an initialization circuit.

22. The system, as recited in claim 21, further comprising:
the initialization circuit including a first circuit, the first circuit being coupled td a first node and the power supply, the first circuit generating an enable signal having a response based at least in part on the power supply and the first predetermined voltage.

23. The system, as recited in claim 22, wherein the initialization circuit includes a second circuit responsive to the enable signal and having a first switching threshold level for a rising enable signal and a second switching threshold for a falling enable signal.

24. The system, as recited in claim 22, wherein the plurality of driver circuits are effectively disabled after initializing the memory array and while the power supply effectively maintains a voltage greater than a second predetermined voltage.

25. The system, as recited in claim 21, wherein the initialization circuit comprises:
a first node, the first node conveying an enable signal;
a second node, the second node conveying an initialization signal;
a level shifting circuit coupled to the first node and a power supply node, the level shifting circuit generating the enable signal based at least in part on a signal conveyed by the power supply node and a predetermined initialization disable voltage;
a hysteresis circuit coupled to the first and second nodes, the hysteresis circuit generating the initialization signal; and
wherein the plurality of data circuits comprise at least one latch node coupled to receive a first predetermined state in response to a first signal based at least in part on the initialization signal.

26. The system, as recited in claim 25, wherein the latch node is coupled to power up having a predetermined state.

27. The system, as recited in claim 25, wherein the latch node is coupled to receive data after the latch node is initialized.

28. The system as recited in claim 25, wherein the level shifting circuit includes a variable number of level shifting stages.

29. The system, as recited in claim 28, wherein each level shifting stage includes a series device coupled to a load device.

30. The system as recited in claim 29, wherein the series device is a p-type transistor having a gate coupled to a ground node.

31. The system, as recited in claim 29, wherein the load device is a weak n-type transistor having a gate coupled to a power supply node.

32. The system, as recited in claim 25, further comprising: a first selectable connector coupled to the latch node.

33. The system, as recited in claim 32, wherein the latch node is selectably coupled to receive the predetermined state in response to the first signal based at least in part on the initialization signal.

34. The system, as recited in claim 25, further comprising: a weak device coupled to the second node.

35. The system, as recited in claim 34, wherein the weak device is coupled to prevent the second node from discharging.

36. The system as recited in claim 25, wherein the hysteresis circuit has a first switching threshold level for a rising enable signal and a second switching threshold for a falling enable signal.

37. The system, as recited in claim 36, wherein the hysteresis circuit is a Schmitt trigger circuit.

38. The system, as recited in claim 25, wherein the plurality of serially connected word line-driver initialization circuits comprises at least one circuit responsive to a first pulse based at least in part on the initialization signal, and coupled to select at least one row of the memory cells during a first interval.

39. The system, as recited in claim 38, wherein the plurality of serially connected word line-driver initialization circuits comprises at least one additional circuit responsive to a second pulse and coupled to select an additional row of the memory cells during a second interval.

40. The system, as recited in claim 39, wherein the second pulse is later than the first pulse.

41. The system, as recited in claim 25, further comprising: a write enable node coupled to receive a second predetermined state in response to a signal based at least in part on the initialization signal, wherein the second predetermined state enables writes to the memory cells.

42. The system, as recited in claim 16, further comprising: a plurality of delay elements corresponding to respective ones of the plurality of word line driver initialization circuits.

43. The system, as recited in claim 16, embodied in computer readable descriptive form suitable for use in design, test, or fabrication of an integrated circuit.

44. An apparatus comprising:
means for detecting that a power supply operably coupled to the memory circuit first achieves a first predetermined voltage; and
means for asynchronously pulsing successive word line groups of one or more individual word lines of the memory array while conveying a data pattern onto bit lines of the memory array, to thereby write the data pattern into memory cells associated with each such word line group.

45. The apparatus, as recited in claim 44, further comprising:
means for pulsing a first word line group in response to an input signal received from an earlier pulsed second word line group;
means for generating an output signal delayed from the input signal; and
means for conveying the delayed output signal to a third word line group.

46. The apparatus, as recited in claim 44, further comprising:
means for ensuring at least one data latch powers up having a first predetermined state corresponding to at least one bit of the data pattern.

47. The apparatus, as recited in claim 44, further comprising:
means for ensuring a write enable latch node powers up having a state for enabling bit line drivers to the memory circuit.

48. The apparatus, as recited in claim 44, further comprising:
means for effectively disabling initialization circuitry after initializing the memory circuit.

49. The apparatus, as recited in claim 44, further comprising:
means for selectively configuring the data pattern.

* * * * *

UNITED STATES PATENT AND TRADEMARK OFFICE
CERTIFICATE OF CORRECTION

PATENT NO.        : 7,085,176 B1
APPLICATION NO.   : 10/771526
DATED             : August 1, 2006
INVENTOR(S)       : Howard L. Levy et al.

It is certified that error appears in the above-identified patent and that said Letters Patent is hereby corrected as shown below:

Col. 3, line 64, please replace "edge of NIT" with --edge of INIT--.
Col. 8, line 29, please replace "coupled td a" with --coupled to a--.

Signed and Sealed this

Twenty-fourth Day of October, 2006

JON W. DUDAS
*Director of the United States Patent and Trademark Office*